(12) United States Patent
Smolke et al.

(10) Patent No.: US 9,186,694 B2
(45) Date of Patent: Nov. 17, 2015

(54) MODULAR-CONSTRUCTION VACUUM-COATING SYSTEM

(75) Inventors: Matthias Smolke, Leipzig (DE); Matthias Klooss, Dresden (DE); Andrej Wolf, Dresden (DE); Johannes Struempfel, Dresden (DE)

(73) Assignee: VON ARDENNE GmbH, Dresden (DE)

( * ) Notice: Subject to any disclaimer, the term of this patent is extended or adjusted under 35 U.S.C. 154(b) by 0 days.

(21) Appl. No.: 13/700,811

(22) PCT Filed: Jun. 14, 2011

(86) PCT No.: PCT/EP2011/059813
§ 371 (c)(1),
(2), (4) Date: Feb. 19, 2013

(87) PCT Pub. No.: WO2011/154554
PCT Pub. Date: Dec. 15, 2011

(65) Prior Publication Data
US 2013/0139750 A1    Jun. 6, 2013

(30) Foreign Application Priority Data
Jun. 11, 2010   (DE) .................. 10 2010 030 006

(51) Int. Cl.
*B05C 9/08* (2006.01)
*C23C 14/56* (2006.01)

(52) U.S. Cl.
CPC . *B05C 9/08* (2013.01); *C23C 14/56* (2013.01); *C23C 14/568* (2013.01)

(58) Field of Classification Search
CPC .......... B05C 9/08; C23C 14/568; C23C 14/56
USPC ....................................................... 118/719
See application file for complete search history.

(56) References Cited

U.S. PATENT DOCUMENTS

| 4,042,128 A * | 8/1977 | Shrader .................... 118/719 |
| 7,413,639 B2 * | 8/2008 | Hattendorf et al. ........... 118/719 |
| 2006/0260938 A1 * | 11/2006 | Petrach ................ 204/298.16 |
| 2008/0202420 A1 | 8/2008 | Smith et al. |
| 2008/0213477 A1 | 9/2008 | Zindel et al. |

FOREIGN PATENT DOCUMENTS

| CN | 1854329 A | 11/2006 |
| DE | 10341244 A1 | 5/2005 |
| DE | 202005006309 U1 | 6/2005 |
| DE | 102008030677 A1 | 10/2009 |
| EP | 2009675 A1 | 12/2008 |

OTHER PUBLICATIONS

International Search Report for PCT/EP2011/059813 dated Nov. 2, 2011.
Office Action dated Oct. 15, 2013 issued in corresponding German patent application No. 10 2010 030 006.3.
Office Action dated Feb. 27, 2014 issued in corresponding Chinese patent application No. 201180028799.

* cited by examiner

*Primary Examiner* — Dah-Wei D Yuan
*Assistant Examiner* — Stephen Kitt
(74) *Attorney, Agent, or Firm* — Heslin Rothenberg Farley & Mesiti P.C.

(57) ABSTRACT

A modular-construction vacuum-coating system includes a plurality of functional chambers arranged one behind the other along a longitudinal extent in which substrates are moved through the chambers in a substrate-transporting region. To lower the production-related and installation-related outlay involved in supplying media, a functional chamber, as a first submodule, is arranged in a first module and provided with an outer interface which is the same for at least a second module.

6 Claims, 7 Drawing Sheets

FIG 11

Level 0: Vacuum system for coating a substrate of defined size in a predetermined cycle time by means of technology Level 1: Modules and sum modules, including necessary media connections between the modules Level 2: Submodules, including necessary media connections between the submodules Level 3: Subassemblies and individual parts

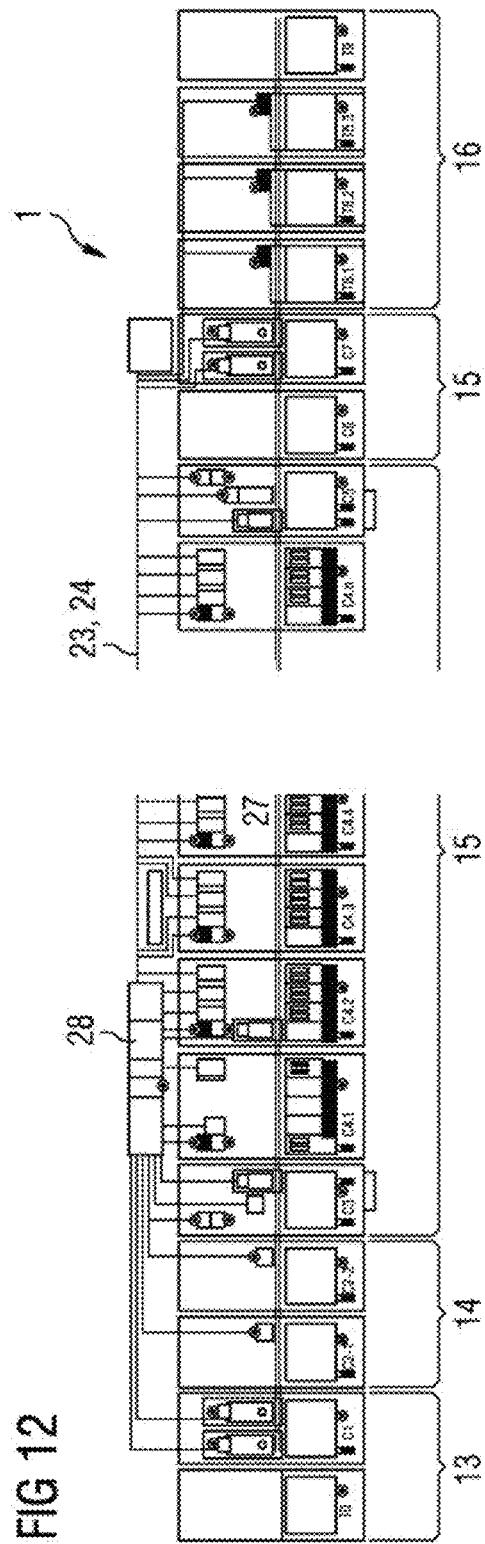

MODULAR-CONSTRUCTION VACUUM-COATING SYSTEM

CROSS REFERENCE TO RELATED APPLICATIONS

This application is a national stage filing under section 371 of International Application No. PCT/EP2011/059813 filed on Jun. 14, 2011, and published in German on Dec. 15, 2011 as WO 2011/154554 A1 and claims priority of German application No. 10 2010 030 006.3 filed on Jun. 11, 2010, the entire disclosure of these applications being hereby incorporated herein by reference.

BACKGROUND ART

The invention relates to a modular-construction vacuum-coating system with a plurality of functional chambers which are arranged one behind the other along a longitudinal extent in which substrates are moved through the chambers in a substrate transport region.

Vacuum-coating systems are defined by functional and physical division.

The physical division defines a visible configuration of a vacuum-coating system. The physical configuration does not necessarily correspond to the functional configuration.

Figure 1:
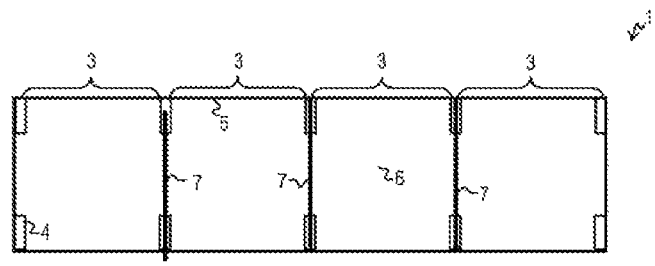
Figure 2:
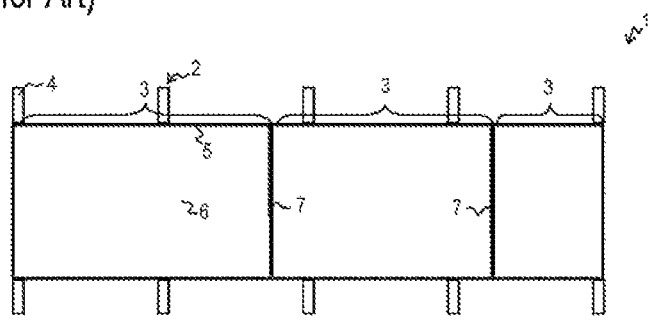

The parts of the physical division of a vacuum-coating system 1 are system chambers 2 and sections 3, such as are illustrated in FIG. 1 and FIG. 2. To distinguish between the physical and the functional division, the (physical) chambers are designated as system chambers 2.

A structural unit connected in a materially integral way and containing stiffening elements 4 is designated as a system chamber 2 of a vacuum-coating system. Connected to the stiffening elements 4 are wallings 5 which enclose a vacuum space 6. The wallings 5 are formed from a chamber floor, chamber walls and a chamber ceiling. A walling 5 may also be formed from a cover laid on a sealing surface.

The stiffening elements 4 of the system chamber 2 may lie inside the vacuum space 6, as illustrated in FIG. 1. At least part of the system chamber 2 then consequently projects into the vacuum space 6.

Correspondingly, solutions are also known in which the system chamber 2 constitutes a structural unit as a kind of "skeleton" which dispenses with stiffening elements 4 in the vacuum space 6 since these are arranged outside the vacuum space 6.

A plurality of system chambers 2 are conventionally connectable to one another by means of releasable connections, usually via chamber flanges. Each system chamber 2 can then have a dedicated vacuum space. The vacuum of vacuum spaces adjacent to one another may also merge one into the other and consequently form a unit.

A portion which is delimited by walls 7 fastened in the vacuum space 6 transversely to the longitudinal extent of the vacuum-coating system and which is located inside a vacuum space 6 is designated as a section 3.

Insofar as essentially one function is performed in a section 3, the sections may also be designated by the designation of this function for which they mainly serve, such as process section, pumping section, coating section or the like.

The functional division describes a configuration, determined by the function of the individual parts, of a vacuum-coating system. The functional division is not necessarily visible.

Figure 3:
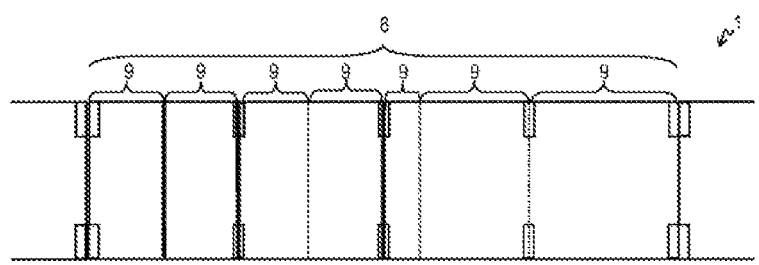

The parts of the functional division are chambers 8 and compartments 9, as illustrated in FIG. 3.

A chamber 8 is a unit with one or more interacting functions within the limits of one or more connected physical system chambers 2.

The chambers 8 of the functional division may also be designated by the designation of the function for which they mainly serve, such as process chamber. Since all the chambers 8 serve for accommodating the vacuum, they may also be designated in general as vacuum chambers.

The compartments 9 may also be named by the designation of their function, for example as a pumping compartment, sputtering compartment, gas separation compartment or the like.

A compartment 9 is a functional unit inside a chamber 8 of a longitudinally extended vacuum-coating system, to which functional unit a function is unequivocally attributed and which functional unit is arranged in succession with other such functional units along the longitudinal extent of the vacuum-coating system. Compartments 9 preferably have an identical length. A compartment 9 may be formed above or below the substrate transport region or so as to include the substrate transport region.

Figure 4:
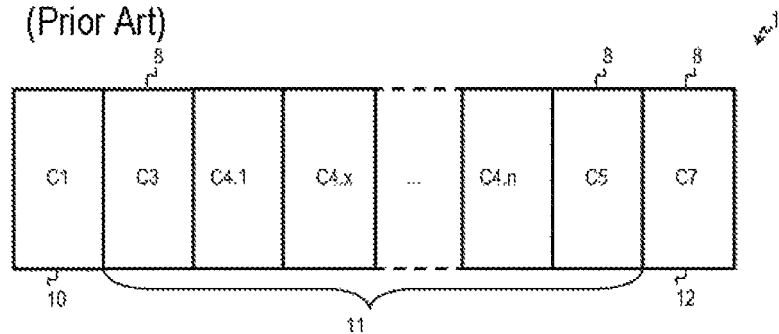

A configuration of a 3-chamber system or a 5-chamber system will be given as an example of a functional division:

A 3-chamber system, as illustrated in FIG. 4, is composed of a first (functional) chamber 10, to be precise the entry lock C1 (in a physical system chamber 2), a second (functional) chamber 11, itself composed of a first transfer chamber C3 (in a physical system chamber 2), a process chamber C4.1 and possible further process chambers C4.x to C4.n (in one or more physical system chambers (2) and a second transfer chamber C5 (in a physical system chamber 2), and a third (functional) chamber 12, to be precise the exit lock C7 (in a physical system chamber 2).

Figure 5:
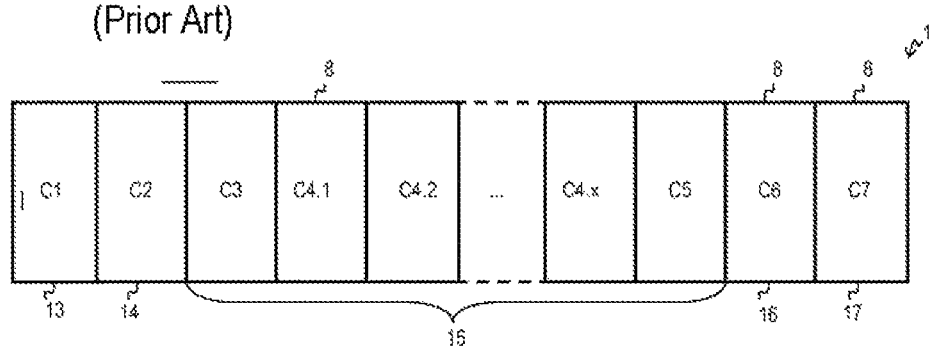

A 5-chamber system, as illustrated in FIG. 5, is composed of a first (functional) chamber 13, to be precise the entry lock C1 (in a physical system chamber 2), a second (functional) chamber 14, to be precise a first buffer chamber C2 (in a physical system chamber 2), a third (functional) chamber 15, itself composed of a first transfer chamber C3 (in a physical system chamber 2), a process chamber C4.1 or possible further process chambers C4.x to C4.n (in a physical system chamber 2) and a second transfer chamber C5 (in a physical system chamber 2), a fourth (functional) chamber 16, to be precise a second buffer chamber C6 (in a physical system chamber 2) and a fifth (functional) chamber 17, to be precise the exit lock C7 (in a physical system chamber 2).

All the chambers 10 to 17 have to be supplied with different media. Such media are, in particular, a vacuum, compressed air, gases, water, current and data.

The various media supplies are combined wholly or partially, depending on the system. Thus, it is possible to combine the current supply for the entire system and to supply each individual chamber 10 to 17 from this. The chambers requiring a water supply are fed from a central water supply, etc.

The disadvantage in this case is that the media supply has to be planned and adapted individually for each vacuum-coating system, thus resulting in a high outlay in terms of production and installation.

Accordingly, the object of the invention is to lower the outlay in terms of production and installation in media supplies of vacuum-coating systems.

BRIEF SUMMARY OF INVENTION

Accordingly, a functional chamber is arranged as a first submodule in a module which is provided with an outer interface identical for at least one second module.

Such an interface configuration makes it possible to manufacture the modules completely as units, since the individual set-up can be implemented in the module itself. These modules have an identical outward configuration.

In this case, there is the possibility that the interface is designed as a media interface supplying the first submodule with at least one medium. It is expedient, however, also to provide connection possibilities for other media at the interface, even if these are not required in the module. This results in a unification of the interface throughout the entire vacuum-coating system.

The term "media" is understood here to mean all that is delivered to a module or discharged from a module, in particular data, switching signals, safety signals, water, electrical energy or gases.

Internal media distribution can preferably be implemented in that the module has arranged in it in each case a second submodule which acts as a media supply for the first submodule and which is provided with the outer media interface identical for all modules.

Preferably, a media line is arranged continuously through the entire vacuum-coating system, to which media line a module is connected by means of its second submodule via the outer media interface of the latter. In this case, there is the possibility of simply looping through media which are not required at a module.

As already defined, the media may be of many different kinds. Accordingly, in one refinement, the interface of the second submodule has a connection at least to a media line from the group comprising a databus line, emergency/off loop, safety loop, water line, current supply line and gas line.

The modular set-up can preferably be continued in that it is not restricted only to media. Accordingly, there is provision for designing the interface as a connection interface connecting the first submodule to a first submodule of an adjacent module. Such a connection interface may be of purely mechanical design, for example as a flange between two system chambers or as an interface between the parts of the transport system which lie in each chamber.

A module may in this case also have at least two interfaces, to be precise a first interface, which is designed as a media interface, and a second interface, which is designed as a connection interface. It is consequently possible to produce completely independent modules.

For central supply tasks, for example for central media sources or the installation of a system computer, it is possible that a sum module supplying a plurality of modules of the vacuum-coating system with one or more media is arranged.

BRIEF DESCRIPTION OF DRAWING FIGURES

Figure 6:
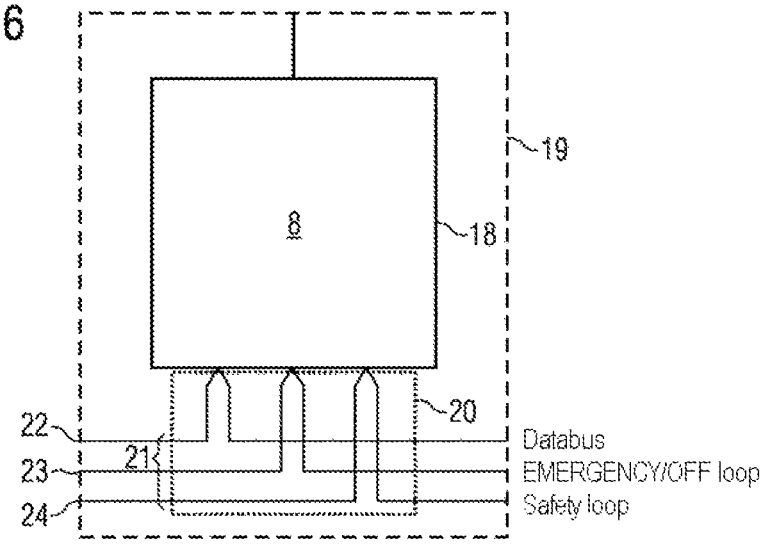
Figure 7:
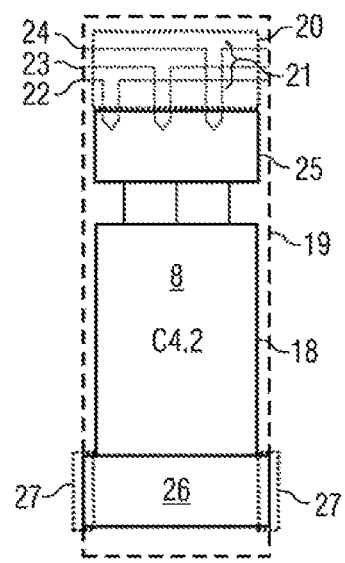
Figure 8:
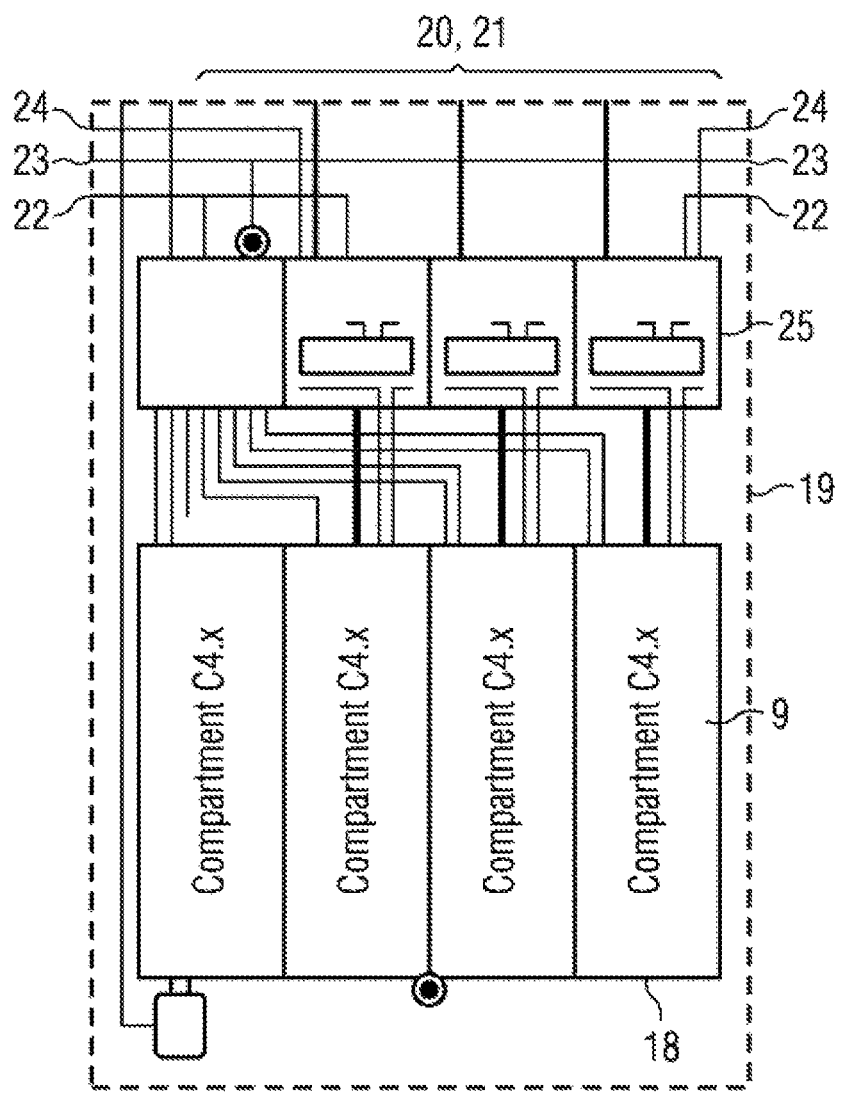
Figure 9:
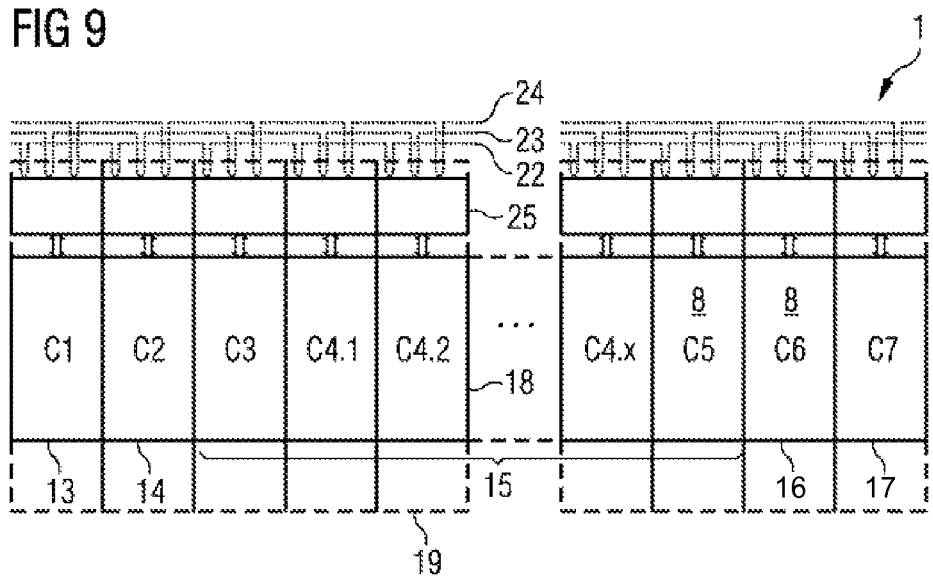
Figure 10:
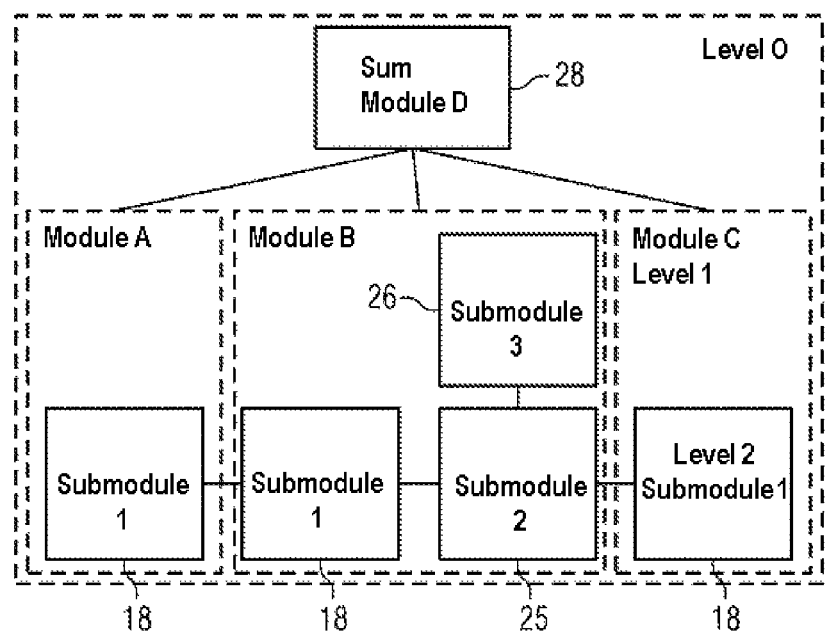

The invention will be explained in more detail below by means of an exemplary embodiment. In the accompanying drawings:

FIG. 1 shows a physical division of a vacuum-coating system with an internal system chamber according to the prior art, FIG. 2 shows a physical division of a vacuum-coating system with an external system chamber according to the prior art, FIG. 3 shows a functional division of a vacuum-coating system according to the prior art, FIG. 4 shows a diagrammatic illustration of a 3-chamber system according to the prior art, FIG. 5 shows a diagrammatic illustration of a 5-chamber system according to the prior art, FIG. 6 shows a module according to the invention, FIG. 7 shows a module according to the invention with submodules, FIG. 8 shows a module according to the invention with a chamber, divided into compartments, as a first submodule, FIG. 9 shows an assembly of modules to form a vacuum-coating system, FIG. 10 shows a diagrammatic arrangement of a sum module, FIG. 11 shows an illustration of a multi-level model, and FIG. 12 shows an illustration of a complete vacuum-coating system according to the invention.

DETAILED DESCRIPTION

FIG. 1 to FIG. 5 show a vacuum-coating system 1 according to the prior art, as described above. A certain modular type of construction is already implemented in this, in that it is subdivided into chambers 8 and compartments 9 and, for example, there is an effort to configure the chambers 8 with an identical length, as illustrated in FIG. 4 and FIG. 5, in order thereby to arrive at a higher degree of repeatability in terms of components.

According to the invention, a functional chamber 8 is arranged as a first submodule 18 in a module 19 which is provided with an outer interface 20 identical for other modules.

Such an interface 20 may be designed as a media interface 21 such that it can be connected to a databus line 22, an emergency/off loop 23, a safety loop 24, a water line, a current supply line or a gas line. The drawings illustrate diagrammatically only the databus line 22, emergency/off loop 23 and safety loop 24 to represent all the possible media lines. It is therefore possible to lead the media lines 22; 23; 24 through the entire vacuum-coating system 1 in a unitary way. A single individual connection of each chamber 8 to the media apparatus may therefore be dispensed with. For selected media, on account of their media demand, there is the possibility of supplying the module 19 or submodule 18 directly from a sum module, as may be implemented, for example, in the supply of electrical energy.

As illustrated in FIG. 7, to FIG. 9, the module 19 has arranged in it in each case a second submodule 25 which acts as a media supply for the first submodule 18 and which is provided with the outer media interface 21 identical for all the modules 19. A module 19 is consequently connected by means of its second submodule 25 via the outer media interface 21 of the latter.

If a chamber 8 as a first submodule 18 contains a plurality of compartments 9, the second submodule 25 may be designed such that each compartment 9 can be connected to the various media according to its function. Despite this individual internal configuration, however, the module 19 has outwardly a uniform configuration of the interface 20.

There is also the possibility that a chamber 8 requires only a selection of media. For example, a lock chamber will not require water. In this case, nevertheless, a water connection is provided by the module 19 at the media interface 21. The water line is then simply "looped through" in the module 19, in particular in the second submodule 25.

As illustrated in FIG. 9, the media interfaces 21 of the individual modules 19 may also be designed such that they are connected directly to the in each case adjacent module and a closed media line 22; 23; 24 is thus formed.

As illustrated in FIG. 7, however, submodule formation may be carried out beyond straightforward media supply. To be precise, the transport system for transporting the substrates inside a chamber 8 may thus be designed as a third submodule 26 in that it is provided with connection interfaces 27. These connection interfaces 27 are then suitable for connecting the third submodule 26 to a third submodule 26 of an adjacent module, that is to say that portion of the transport system which belongs to a chamber 8 to the portion of the transport system in the adjacent chamber 8.

FIG. 10 illustrates a sum module 28. Such a sum module 28 is provided in the vacuum-coating system 1 for each medium and ensures that the media supply of the respective medium to all the modules 19 is combined. A sum module 28 of this type may comprise, for example, a central water treatment system or central energy distribution.

It consequently becomes clear that the set-up according to the invention implements in a vacuum-coating system 1 a multi-level model, as illustrated in FIG. 11, thus ensuring a high degree of repeatability, particularly at levels 2 and 3. It also becomes possible to manufacture the modules 19 and sum modules 28 completely separately and to test them after manufacture. A complete test has hitherto been possible according to the prior art only after the completion of the entire vacuum-coating system 1. The modules 19 and sum modules 28 can then be brought essentially in a complete state to the place of assembly. They essentially merely have to be connected there. The outlay in terms of assembly is reduced considerably. FIG. 12 shows the very clearly subdivided set-up of a vacuum-coating system 1 completed in this way.

The invention claimed is:

1. A modular-construction vacuum-coating system, comprising a plurality of functional modules performing different functions respectively, including at least one functional module serving as an entry lock chamber and a plurality of second functional modules performing substrate processing arranged one behind another along a longitudinal extent in which substrates are moved through the functional modules in a substrate transport region, wherein each of said plurality of second functional modules contains both a functional chamber arranged as a first submodule, and a single second submodule receiving media from media lines and supplying media to the first submodule and having a module level outer media interface with a uniform outward configuration connecting each of said plurality of second functional modules of the system to all media lines of the system, the module level outer media interface of all of the plurality of second functional modules being identical, wherein the functional chamber of each respective second functional module performing substrate processing comprises a plurality of functional compartments performing at least two different functions arranged in succession along said longitudinal extent all connected to the single second submodule of the respective second functional module, wherein all media lines of the system comprise all lines that deliver media to, or discharge media from the plurality of functional modules, and the media comprises data, switching signals, safety signals, water, electrical energy and gases that are employed by the vacuum-coating system.

2. The vacuum-coating system as claimed in claim 1, wherein the module level outer media interface of the second submodule connects each of the plurality of second functional modules to a databus line, emergency/off loop, safety loop, water line, current supply line and gas line.

3. The vacuum-coating system as claimed in claim 1, further comprising a connection interface connecting the first submodule of a first functional module to a first submodule of an adjacent functional module.

4. The vacuum-coating system as claimed in claim 1, wherein at least one functional module has a second interface which serves as a transport system connection interface.

5. The vacuum-coating system as claimed in claim 1, further comprising a sum module supplying a plurality of functional modules of the vacuum-coating system with one or more media.

6. The vacuum-coating system as defined in claim 1, wherein a media not required by a respective second functional module is introduced into the second submodule of the respective second functional module without passage of the media to the first submodule of the respective second functional module.

\* \* \* \* \*